US011539280B2

(12) United States Patent
Geerts et al.

(10) Patent No.: US 11,539,280 B2
(45) Date of Patent: Dec. 27, 2022

(54) ACTUATOR, LINEAR MOTOR AND LITHOGRAPHIC APPARATUS (71) Applicant: ASML Netherlands B.V., Veldhoven (NL)

(72) Inventors: Niels Cornelis Petrus Johannes Geerts, Veldhoven (NL); Franciscus Stadhouders, Eindhoven (NL); Erwin Gerardus Bernardus Hofste, Vasse (NL)

(73) Assignee: ASML Netherlands B.V., Veldhoven (NL)

( * ) Notice: Subject to any disclaimer, the term of this patent is extended or adjusted under 35 U.S.C. 154(b) by 248 days.

(21) Appl. No.: 16/617,021

(22) PCT Filed: May 3, 2018

(86) PCT No.: PCT/EP2018/061265
§ 371 (c)(1),
(2) Date: Nov. 26, 2019

(87) PCT Pub. No.: WO2018/215183
PCT Pub. Date: Nov. 29, 2018

(65) Prior Publication Data
US 2021/0126518 A1 Apr. 29, 2021

(30) Foreign Application Priority Data
May 26, 2017 (EP) .................................... 17173011

(51) Int. Cl.
*G03F 7/20* (2006.01)
*H02K 41/03* (2006.01)
(Continued)

(52) U.S. Cl.
CPC ....... *H02K 41/031* (2013.01); *G03F 7/70758* (2013.01); *G03F 7/70775* (2013.01);
(Continued)

(58) Field of Classification Search
CPC ........ H02K 41/031; H02K 7/12; H02K 9/227; G03F 7/70775; G03F 7/70758
See application file for complete search history.

(56) References Cited

U.S. PATENT DOCUMENTS

| 8,610,089 B2 | 12/2013 | Donders et al. |
| 8,830,020 B2 | 9/2014 | Koop et al. |

(Continued)

FOREIGN PATENT DOCUMENTS

| CN | 2013-64459 Y | 12/2009 |
| CN | 102214975 A | 10/2011 |

(Continued)

OTHER PUBLICATIONS

International Search Report and Written Opinion of the International Searching Authority directed to related International Patent Application No. PCT/EP2018/061265, dated Aug. 17, 2018; 8 pages.

(Continued)

*Primary Examiner* — Hung V Nguyen
(74) *Attorney, Agent, or Firm* — Sterne, Kessler, Goldstein & Fox P.L.L.C.

(57) ABSTRACT

An actuator comprises a coil, a first cooling plate and a second cooling plate. The cooling plates are configured to cool the coil. The first and second cooling plates are arranged at opposite sides of the coil to be in thermal contact with the coil. The coil comprises a first coil part and a second coil part, the first coil part facing the first cooling plate and the second coil part facing the second cooling plate, the first and second coil parts being separated by a spacing there between. The first cooling plate, the first coil part, the spacing, the second coil part and the second cooling plate form a stacked structure whereby the coil parts are arranged between the cooling plates and the spacing is arranged between the coil parts. The actuator further comprises a (Continued)

filling element arranged in the spacing. The filling element to push the first coil part towards the first cooling plate and to push the second coil part towards the second cooling plate.

14 Claims, 3 Drawing Sheets

(51) Int. Cl.
*H02K 9/22* (2006.01)
*H02K 7/12* (2006.01)
(52) U.S. Cl.
CPC ............... *H02K 7/12* (2013.01); *H02K 9/223* (2021.01); *H02K 9/227* (2021.01)

(56) References Cited

U.S. PATENT DOCUMENTS

| | | | | |
|---|---|---|---|---|
| 10,114,300 | B2* | 10/2018 | Cox | ............... H02K 1/06 |
| 10,867,385 | B2* | 12/2020 | Hibbard | ............... G06T 7/38 |
| 2004/0218166 | A1 | 11/2004 | Vreugdewater et al. | |
| 2012/0062866 | A1 | 3/2012 | Binnard et al. | |
| 2012/0170016 | A1 | 7/2012 | Zordan | |
| 2013/0069449 | A1* | 3/2013 | Pharand | ............... H02K 41/031 310/12.02 |
| 2014/0132088 | A1 | 5/2014 | Morel | |
| 2015/0212435 | A1 | 7/2015 | Cox et al. | |
| 2015/0280539 | A1 | 10/2015 | Kollen et al. | |

FOREIGN PATENT DOCUMENTS

| | | |
|---|---|---|
| JP | 2004-180361 A2 | 6/2004 |
| JP | 2011-083180 A | 4/2011 |
| JP | 2012-227528 A | 11/2012 |
| JP | 2016-034193 A | 3/2016 |
| WO | WO 2015/110240 A1 | 7/2015 |

OTHER PUBLICATIONS

International Preliminary Report on Patentability directed to related International Patent Application No. PCT/EP2018/061265, dated Nov. 26, 2019; 6 pages.

* cited by examiner

ACTUATOR, LINEAR MOTOR AND LITHOGRAPHIC APPARATUS

CROSS-REFERENCE TO RELATED APPLICATIONS

This application claims priority of EP application 17173011.2 which was filed on May 26, 2017 and which is incorporated herein in its entirety by reference.

FIELD OF THE INVENTION

The present invention relates to an actuator, a linear motor comprising such actuator and a lithographic apparatus comprising such actuator.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, use may be made of actuators, such as in linear motors, in order to exert a force on movable parts, such as the substrate table that holds the substrate or the support that holds the patterning device. The actuator comprises a coil in order to generate a magnetic field when powered by an electrical current. In the lithographic apparatus, as well as in other applications, a high magnetic field may be desired, e.g. to enable to generate a high actuator force. The high force may enable the actuator to facilitate high levels of acceleration.

As a high electrical current level in the coil increases an electrical dissipation in the coil, cooling plates may be arranged, e.g. on either sides of the coil. The cooling plates may conduct heat away from the coil, thereby lowering a temperature of the coil. As the coil is formed by winding, an overall dimension of the coil may show some degree of tolerance. A total dimension of the actuator may be set to high levels of accuracy, as the actuator may be required to operate e.g. in an accurately defined space, e.g. a gap between permanent magnets forming part of a motor. Therefore, the allowed tolerances in total dimension of the actuator may be lower than a tolerance of the dimension of the coil. As a result, a distance between the coil and the cooling plate may be subject to a relatively large tolerance. The tolerance of the distance between the coil and the cooling plate causes a thickness of an intermediate structure such as potting material to fluctuate, hence resulting in a relatively large tolerance of a thermal resistance between the coil and the cooling plate.

Resulting differences in heat transfer between the coil and the cooling plate may result in a tolerance band of a temperature of the coil, given a certain electrical current applied to it. This effect even gets worse when the generated heat also causes an increase in the resistance of the coil, which may result in failure when over-heating. Hence, safety margins are to be kept to avoid over-heating the coil, based on worst case thermal resistance scenario's.

SUMMARY OF THE INVENTION

It is desirable to improve a thermal behavior of the actuator.

According to an aspect of the invention, there is provided an actuator comprising
a coil,
a first cooling plate and a second cooling plate, the cooling plates being configured to cool the coil, the first and second cooling plates being arranged at opposite sides of the coil to be in thermal contact with the coil, wherein the coil comprises a first coil part and a second coil part, the first coil part facing the first cooling plate and the second coil part facing the second cooling plate, the first and second coil parts being separated by a spacing there between,
wherein the first cooling plate, the first coil part, the spacing, the second coil part and the second cooling plate form a stacked structure whereby the coil parts are arranged between the cooling plates and the spacing is arranged between the coil parts, and
wherein the actuator further comprises a filling element arranged in the spacing, the filling element to push the first coil part towards the first cooling plate and to push the second coil part towards the second cooling plate.

According to an aspect of the invention, there is provided a linear motor comprising such an actuator.

According to an aspect of the invention, there is provided a lithographic apparatus comprising such an actuator.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
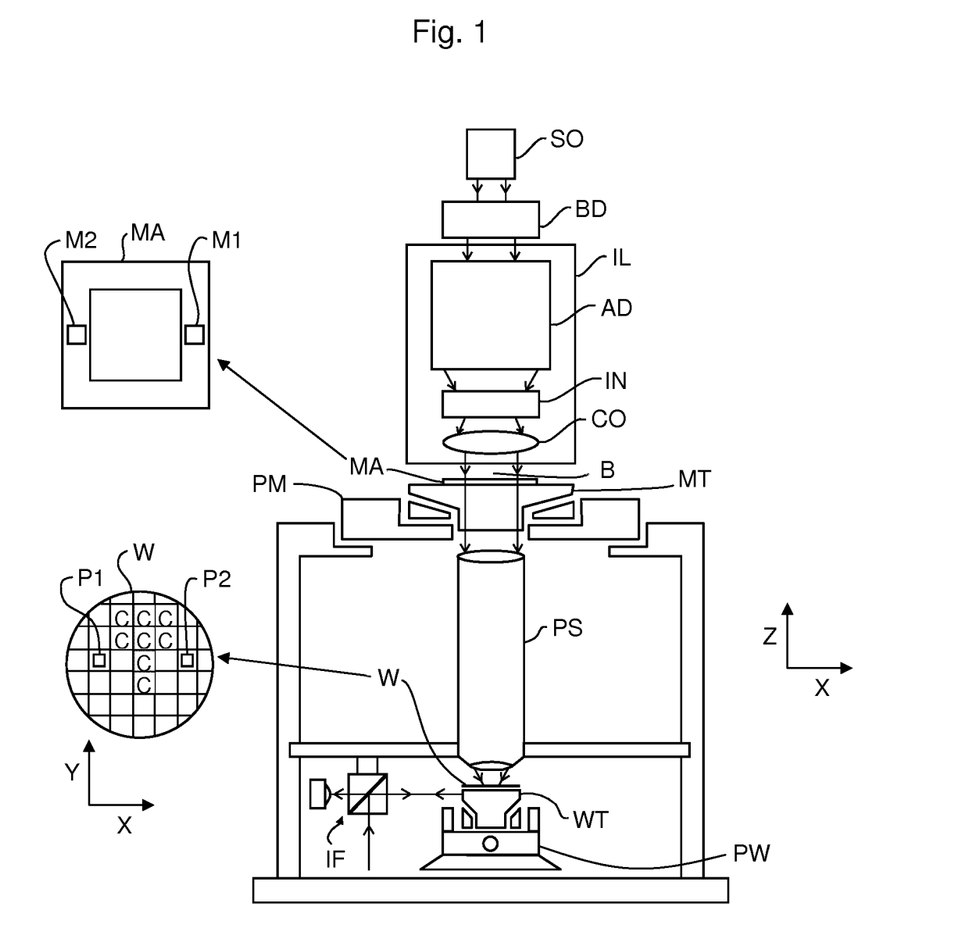
FIG. 1 depicts a lithographic apparatus in which an embodiment of the invention may be provided.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
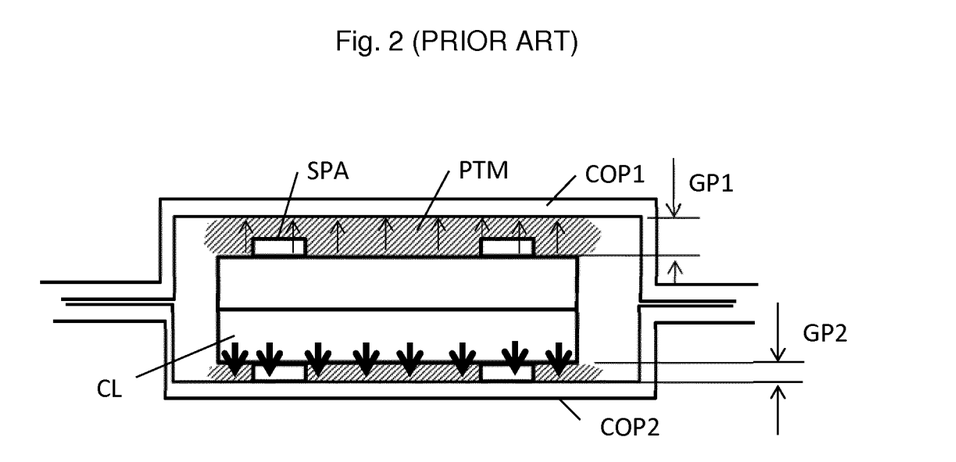
FIG. 2 depicts a schematic, cross sectional view of a prior art actuator.

FIG. 2 depicts a cross sectional view of an exemplary embodiment of a prior art actuator. A coil CL is arranged between a first cooling plate COP1 and a second cooling plate COP2. A gap GP1 between the upper side of the coil and the first cooling plate COP1 is filled with potting material PTM. A gap GP2 between the lower side of the coil and the second cooling plate COP2 is likewise filled with potting material PTM. Spacers SPA may keep the coil at a minimum distance from the cooling plates. As an overall dimension (e.g. actuator thickness) from the top of the first cooling plate COP1 to the bottom of the second cooling plate COP2 may be accurately set, a tolerance of the height of the coil may result in a tolerance of the thickness of the potting material PTM between, in the present example, the first cooling plate COP1 and the coil.

As a result of the tolerance in the thickness of the potting material, a tolerance band of the heat transfer between the coil and the cooling plate may occur. The tolerance band in heat transfer may nog only result in a tolerance band of a temperature of the coil, given a certain electrical current applied to it, however may also result in temperature differences between the top and bottom part of the coil, as the tolerance in the thickness of the potting material may accumulate on one side (i.e. the top side in FIG. 2) This effect even gets worse when the generated heat also causes an increase in the resistance of the coil, which may result in failure when over-heating. Hence, safety margins are to be kept to avoid over-heating the coil, based on worst case thermal resistance scenario's.

Figure 3:
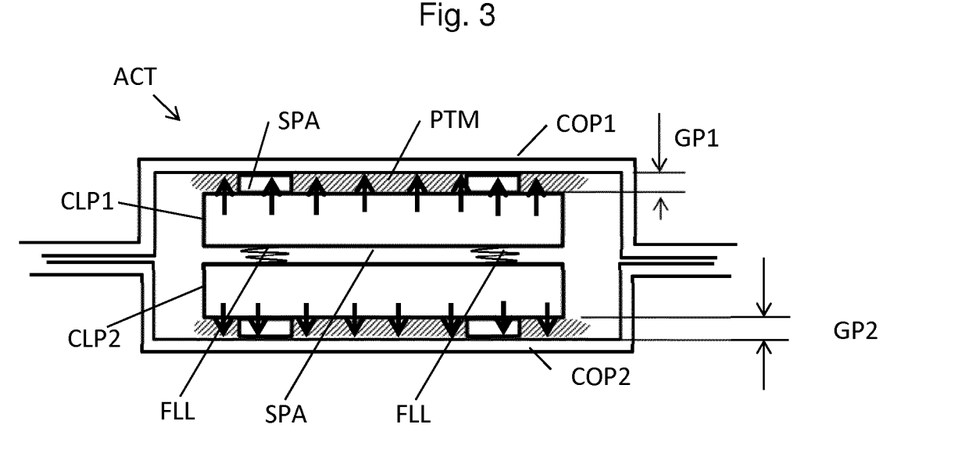
FIG. 3 depicts a schematic, cross sectional view of an actuator according to an embodiment of the invention.

FIG. 3 depicts a cross sectional view of an actuator ACT according to an embodiment of the invention. The actuator comprises a coil CL which is held between cooling plates COP1 and COP 2. The cooling plates each define a plane, in other words, the cooling plates each extend along a plane. Generally, the cooling plates will be parallel, hence the planes along which the cooling plates extend will in general be parallel. The coil CL is split up in a first coil part CLP1 and a second coil part CLP2. The first and second coil parts CLP1, CLP2 may for example be electrically connected in a series connection. A spacing is provided between the first and second coil parts CLP1, CLP2. Hence, the coil parts CLP1, CLP2 are arranged between the first and second cooling plates COP1, COP2, and the spacing SPA is provided between the first and second coil parts CLP1, CLP2, whereby the first and second cooling plates COP1, COP2, the first and second coil parts CLP1, CLP2 and the spacing SPA form a stacked structure. The spacing SPA may extend along the plane of the cooling plates. Thereby, the first coil part CLP1 faces the first cooling plate COP1 and the second coil part CLP2 faces the second cooling plate COP2. Accordingly, the first cooling plate COP1 is in thermal contact with the first coil part CLP1 to conduct away heat from the first coil part CLP1, and the second cooling plate COP2 is in thermal contact with the second coil part CLP2 to conduct away heat from the second coil part CLP2. The actuator further comprises a filling element FLL provided in the spacing SPA of the actuator, i.e. between the first coil part CLP1 and the second coil part CLP2. In the present example, two filling elements in the form of coil springs are depicted. The filling element FLL exerts a force on the first and second coil parts, the force being in a direction perpendicular to the planes of the cooling plates. Thus, the filling element pushes the first coil part towards the first cooling plate and pushes the second coil part towards the second cooling plate. As the filling element pushes the coil parts towards the respective coil plates to which they are facing, a tolerance in the dimensioning of the coils and distance between the coil plates is accommodated by the filling element. Hence, a distance GP1 between the first coil part and the first cooling plate may be accurately dimensioned, irrespective of a thickness of the coil part within the coil part tolerance range. Likewise, a distance GP2 between the second coil part and the second cooling plate may be accurately dimensioned, irrespective of a thickness of the coil parts within the coil part tolerance range. Given a defined distance between the coil parts and the associated cooling plates, a thermal resistance between the respective coil part and the respective cooling plate may be well defined. In an embodiment of the present invention, the filling element may be a flexible, i.e. compressible spacer. In an embodiment, the flexible spacer may comprise a foam such as PU (polyurethane) foam or an extruded polystyrene foam or PE (polyethylene) foam. In an embodiment, the applied foam may be shaped as one or more disks that are applied as flexible spacers between the coil parts. In an embodiment, the flexible spacer may comprise a compressible tape, e.g. a pressure sensitive adhesive (PSA) tape. In an embodiment, the filling element or elements may e.g. comprise a potting compound, whereby the potting component is applied as a plurality of dots in between the coils, whereby the coils are assembled when the potting compound has reached a gel-phase so as to have an increased stiffness.

The cooling plates may comprise plates of a thermally conductive material and may provide passive or active cooling. In the case of active cooling, as an example, cooling ducts may be provided in the cooling plates or in thermal contact with the cooling plates, a cooling fluid being conducted through the cooling ducts. The cooling plates may be separate parts assembled into the actuator. Alternative, the cooling plates may form part of a cooling structure, e.g. a cooling structure manufactured with two cooling surfaces (e.g. a single piece with cooling channels inside, e.g. using a 3D printer), the cooling surfaces facing each other and being spaced apart and having a spacing between them. The coil parts may comprise windings that are wound around a core, the windings may be formed by wires or foil, such as copper or aluminum.

The spacing may have any suitable size, such as for example a thickness in an order of magnitude of 0.1 millimeter to 1 millimeter as measured between the coil parts.

The filling element FLL may comprise a resilient element, such as a piece of resilient material, e.g. a resilient foam. Furthermore or alternatively, the resilient element may comprise a spring, e.g. a leaf spring or a coil spring. As another alternative, the resilient element may comprise a flexible substance such as glue (for example a glue that is heated up to expand to fill at least a part of the spacing). The resilient element is arranged in the spacing in a compressed form, whereby it is compressed in a direction perpendicular to the inner surface of one or both of the cooling plates, a resilience force of the compressed resilient element causing the resilient element to push the first coil part towards the first cooling plate and to push the second coil part towards the second cooling plate. Thereby, the resilient element will accommodate any tolerances of the dimensions of the coil parts in the directions perpendicular to the planes of the cooling plates, allowing to accommodate a tolerance range using a same resilient element.

The filling element may have, when arranged in the spacing, a size to fill a dimension of the spacing in a direction perpendicular to a plane of the cooling plates.

Accordingly, a dimension of the resilient element in uncompressed form and in the direction perpendicular to the planes of the cooling plates, exceeds a dimension of the spacing in said direction. Thus, tolerances in a distance between the inner surfaces of the cooling plates and tolerances in the thickness of the coil parts in the direction perpendicular to the planes of the cooling plates, may be accommodated by the resilient element.

Instead of or in addition to the resilient element, the filling element FLL may comprise a shim, i.e. a filling element that fills the spacing in the direction perpendicular to the planes of the cooling plates, when pushing each one of the coil parts towards its respective facing one of the cooling plates. As the coil parts may exhibit a tolerance in their outer dimensions, and a distance between the inner surfaces of the cooling plates may likewise exhibit a tolerance (e.g. due to tolerance in a thickness of the cooling plates), the dimension of the spacing in the direction perpendicular to the inner surface of one or both of the cooling plates, will accumulate this tolerance. Hence, a dimension of the shim, in the direction perpendicular to the planes of the cooling plates, is accommodated to take this tolerance range into account. The shim may for example be dimensioned to press-fit, in the direction perpendicular to the planes of the cooling plates, into the spacing.

It will be understood that the filling element may be formed by a single element, such as a layer interposed between the first and second coil parts. Alternatively, plural smaller filling elements may be provided in the spacing. For example, 3 filling elements per coil, or 4 filling elements per coil which may provide support in case of some torsional weakness of the coil parts. Furthermore, more than 4 elements could be used in case of thin flexible coil parts.

The filling element may in turn comprise a stacked structure. For example the filling element may comprise a stack of a fin, such as a cooling fin, arranged between shims or resilient elements.

The actuator may further comprise a potting material PTM, wherein a volume of the spacing external to the filling element is filled by the potting material. The potting material may serve to hold the coils in place. The potting material may for example comprise epoxy, polyurethane and/or silicone, such as silicone based glue or gel. When the actuator is operated, the coils may be subjected to forces, such as forces as a result of the coils interacting with magnets of a motor, such as a linear motor. The coils may hence tend to displace themselves within the actuator as a result of operating forces. Furthermore, when the actuator forms part of a movable structure, accelerations of the movable structure may result in further forces on the coils. Still further, the potting material may mitigate forces in operation on the filling element. As the potting material may fill the spacing between the coil parts, any forces on the coil parts that would otherwise act in full on the filling element, may be accommodated at least in part, e.g. for a substantial part, by the potting material, which may assist to keep the coil parts in place, even when applying high currents and the coil parts being subjected to high forces.

As described above, the coil parts may be mechanically fastened by the potting material. Alternatively, the coil parts may be fastened by a mechanic attachment which may provide more freedom to fill the spacing between the coil parts resp. The spacing between the coil parts and the cooling plates with a potting material that has been primarily selected for its thermal properties.

The coil parts may bear against the respective facing cooling plate. Thus, the first coil part may bear against the first cooling plate and the second coil part may bear against the second cooling plate. Hence, a good thermal connection may be achieved between the respective coil part and the respective cooling plate, thus to achieve a low thermal resistance and a high thermal conductivity. Alternatively, one or plural spacers may be provided between the coil parts and the cooling plates, that is one or plural spacers between the first coil part and the first cooling plate and one or plural spacers between the second coil part and the second cooling plate. As a result of the spacers, a defined distance may be provided between the coil parts and the cooling plates. The defined distance may result in respective spacing between each coil part and it's associated cooling plate. Such spacing may be filled, e.g. with the potting material, Hence, a layer of potting material having an accurately defined thickness may be provided between the coil parts and the cooling plates, hence enabling to accurately dimension mechanical holding properties by the layer of potting material on the one hand and thermal resistance of the layer of potting material on the other hand.

The coil parts may each form windings wound about an axis, the axis extending in the direction perpendicular to the planes of the cooling plates. Windings of the first and second coil part may both be wound about an axis extending in vertical direction in the plane of drawing, i.e. an axis extending from one of the cooling plates to the other one of the cooling plates. The fields generated by an electrical current through the coil parts may add up, resulting in a field by the electrical current in the coil parts which is similar to the field provided by a single coil. The coil parts may e.g. be electrically connected in series and may be wound in a same direction (as seen in respect of the axis). The coil parts may be mounted on a common coil core. It is also possible that each coil part is provided with its own core or that no core is used at all.

In an embodiment, the filling element is arranged between isolation layers of the coil parts. The coil parts may be provided with electric isolation layers, such as layers of Kapton material or Teflon material. The isolation layers may provide for electric isolation between the coil parts or in between windings of the coil parts. During manufacturing of the coil, isolation layers may be arranged between the coil parts, whereby one or plural filling elements may be arranged between the isolation layers or between an isolation layer and a coil part. Hence, the coil parts and the filling element(s) may form an integral assembly. The filling element(s) arranged between the isolation layers may for example be formed by resilient elements, thus to accommodate tolerances in dimensions by resiliency as explained above. The isolation layers and the filling element may form a laminated structure, whereby a layer of the filling element is arranged between two isolation layers. The laminated structure may enable to provide the filling element (preferably a resilient filling element) as an integral part of the coil, so that tolerances may be accommodated as described, while little additional steps may be required in the manufacturing of the coil resp, the actuator.

Although the above provides an example of a single spacing between two coil parts, other configurations are possible. For example, a third cooling plate could be arranged in the spacing, i.e. between the first and second coil parts, whereby at least one filling element being arranged in a remaining part of the spacing.

Figure 4:
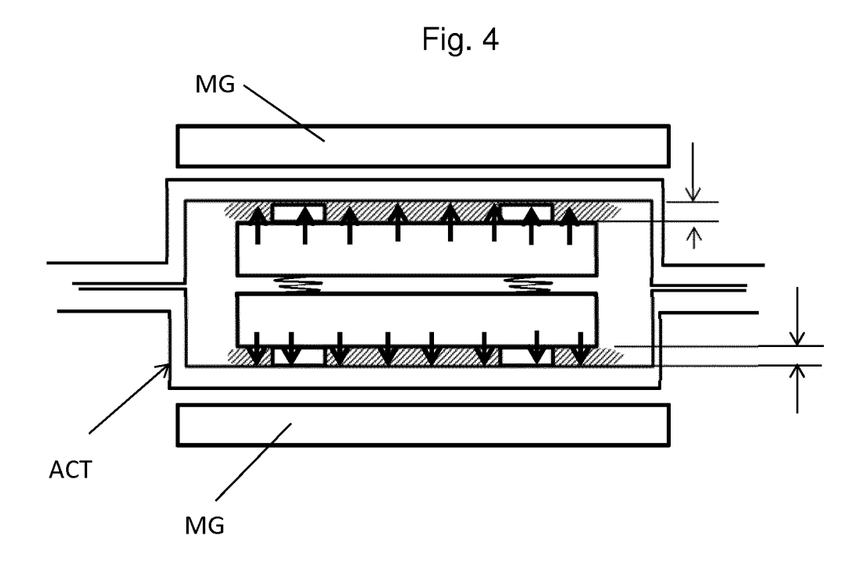
FIG. 4 depicts a schematic, cross sectional view of an actuator according to another embodiment of the invention.

FIG. 4 depicts a linear motor LM comprising an actuator ACT, such as the actuator described above with reference to FIG. 3, and magnets MG on either sides of the actuator. The magnets may be formed by permanent magnets and/or electromagnets. The actuator may provide the linear motor with a defined thermal property, hence enabling to operate the linear motor at well controlled thermal conditions. As a result, the linear motor may be operated at high currents, whereby less safety margin may need to be taken into account for part to part variation in thermal cooling capacity, as a thermal contact between the coil parts forming the coil and the cooling plates may be accurately defined.

The actuator ACT as described above may be comprised in a lithographic apparatus, such as the one described with reference to FIG. 1. Although FIG. 1 primarily relates to a lithographic apparatus having a transmissive type projection system, it will be understood that the actuator may likewise be provided in a lithographic apparatus having a reflective type projection system. The lithographic apparatus may comprise a linear motor, wherein the actuator is comprised in the linear motor. Thus, a actuator, such as a linear motor, may be provided in the lithographic apparatus, the actuator having a defined thermal property, hence enabling to operate the actuator at well controlled thermal conditions. As a result, the actuator of the lithographic apparatus may be operated at high currents, whereby less safety margin may need to be taken into account for part to part variation in thermal cooling capacity, as a thermal contact between the coil parts forming the coil and the cooling plates may be accurately defined.

In the lithographic apparatus, the linear motor may be comprised in one of a first positioner to position the support and a second positioner to position the substrate table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An actuator comprising:
   a coil; and
   a first cooling plate and a second cooling plate, the cooling plates being configured to cool the coil, the first and second cooling plates being arranged at opposite sides of the coil to be in thermal contact with the coil,
   wherein the coil comprises a first coil part and a second coil part, the first coil part facing the first cooling plate and the second coil part facing the second cooling plate, the first and second coil parts being separated by a spacing there between,
   wherein the first cooling plate, the first coil part, the spacing, the second coil part and the second cooling plate form a stacked structure whereby the coil parts are arranged between the cooling plates and the spacing is arranged between the coil parts, and
   wherein the actuator further comprises a filling element arranged in the spacing, the filling element to push the first coil part towards the first cooling plate and to push the second coil part towards the second cooling plate.

2. The actuator of claim 1, wherein the filling element comprises a resilient element arranged in a compressed state in the spacing, the resilient element being compressed in a direction perpendicular to the planes of the cooling plates.

3. The actuator of claim 2, wherein a dimension of the resilient element in uncompressed form and in the direction perpendicular to the planes of the cooling plates exceeds a dimension of the spacing in the direction.

4. The actuator of claim 1, wherein the filling element comprises a shim.

5. The actuator of claim 1, further comprising a potting material, wherein a volume of the spacing external to the filling element is filled by the potting material.

6. The actuator of claim 1, further comprising respective spacers between the respective coil parts and the respective cooling plates.

7. The actuator of claim 1, wherein the coil parts each form windings wound about an axis, the axis extending in the direction perpendicular to the planes of the cooling plates.

8. The actuator of claim 7, wherein the coil parts are mounted on a common coil core.

9. The actuator of claim 1, wherein the filling element is arranged between isolation layers of the coil parts.

10. The actuator of claim 9, wherein the isolation layers and the filling element may form a laminated structure, whereby a layer of the filling element is arranged between two isolation layers.

11. A linear motor comprising:
    an actuator comprising:
    a coil; and
    a first cooling plate and a second cooling plate, the cooling plates being configured to cool the coil, the first and second cooling plates being arranged at opposite sides of the coil to be in thermal contact with the coil,
    wherein the coil comprises a first coil part and a second coil part, the first coil part facing the first cooling plate and the second coil part facing the second cooling plate, the first and second coil parts being separated by a spacing there between,
    wherein the first cooling plate, the first coil part, the spacing, the second coil part and the second cooling plate form a stacked structure whereby the coil parts are arranged between the cooling plates and the spacing is arranged between the coil parts, and
    wherein the actuator further comprises a filling element arranged in the spacing, the filling element to push the first coil part towards the first cooling plate and to push the second coil part towards the second cooling plate.

12. A lithographic apparatus comprising:
    an actuator comprising:
    a coil; and
    a first cooling plate and a second cooling plate, the cooling plates being configured to cool the coil, the first and second cooling plates being arranged at opposite sides of the coil to be in thermal contact with the coil,
    wherein the coil comprises a first coil part and a second coil part, the first coil part facing the first cooling plate and the second coil part facing the second cooling plate, the first and second coil parts being separated by a spacing there between,
    wherein the first cooling plate, the first coil part, the spacing, the second coil part and the second cooling plate form a stacked structure whereby the coil parts are arranged between the cooling plates and the spacing is arranged between the coil parts, and
    wherein the actuator further comprises a filling element arranged in the spacing, the filling element to push the first coil part towards the first cooling plate and to push the second coil part towards the second cooling plate.

13. The lithographic apparatus of claim 12, comprising a linear motor, wherein the actuator is comprised in the linear motor.

14. The lithographic apparatus of claim 13, further comprising:
    a support constructed to support a patterning device, the patterning device being capable of imparting a radiation beam with a pattern in its cross-section to form a patterned radiation beam;
    a substrate table constructed to hold a substrate; and
    a projection system configured to project the patterned radiation beam onto a target portion of the substrate,
    wherein the linear motor may be comprised in one of a first positioner to position the support and a second positioner to position the substrate table.

* * * * *